United States Patent
Bae

(10) Patent No.: US 7,538,699 B2
(45) Date of Patent: May 26, 2009

(54) SINGLE ENDED PSEUDO DIFFERENTIAL INTERCONNECTION CIRCUIT AND SINGLE ENDED PSEUDO DIFFERENTIAL SIGNALING METHOD

(75) Inventor: Seung-jun Bae, Daejeon (KR)

(73) Assignee: Samsung Electronics Co., Ltd, Gyeonggi-do (KR)

( * ) Notice: Subject to any disclaimer, the term of this patent is extended or adjusted under 35 U.S.C. 154(b) by 0 days.

(21) Appl. No.: 11/878,062

(22) Filed: Jul. 20, 2007

(65) Prior Publication Data

US 2008/0048730 A1    Feb. 28, 2008

(30) Foreign Application Priority Data

Jul. 21, 2006    (KR) ............... 10-2006-0068408

(51) Int. Cl.
*H03M 5/00*    (2006.01)
(52) U.S. Cl. .................... 341/55; 341/58
(58) Field of Classification Search ........... 341/55, 341/58, 68; 375/244, 253, 257
See application file for complete search history.

(56) References Cited

U.S. PATENT DOCUMENTS

| | | | | |
|---|---|---|---|---|
| 5,740,201 | A * | 4/1998 | Hui | 375/286 |
| 6,154,498 | A * | 11/2000 | Dabral et al. | 375/257 |
| 6,278,740 | B1 * | 8/2001 | Nordyke | 375/257 |
| 6,377,084 | B1 | 4/2002 | Forbes | |
| 6,999,516 | B1 * | 2/2006 | Rajan | 375/244 |

FOREIGN PATENT DOCUMENTS

| | | |
|---|---|---|
| JP | 2002-204272 | 7/2002 |
| KR | 2001-0082523 | 8/2001 |
| KR | 2003-0034494 | 5/2003 |
| WO | WO 99/48260 | 9/1999 |

* cited by examiner

*Primary Examiner*—Brian Young
(74) *Attorney, Agent, or Firm*—Harness, Dickey & Pierce, PLC

(57) ABSTRACT

A single ended pseudo differential signaling method may add a 1-bit signal to n-bit data if transmitting the n-bit data. Neighboring two signals among the 1-bit signal and data signals are compared to each other to generate detection signals.

26 Claims, 5 Drawing Sheets

SINGLE ENDED PSEUDO DIFFERENTIAL INTERCONNECTION CIRCUIT AND SINGLE ENDED PSEUDO DIFFERENTIAL SIGNALING METHOD

PRIORITY STATEMENT

This application claims the benefit of priority to Korean Patent Application No. 10-2006-0068408, filed on Jul. 21, 2006, in the Korean Intellectual Property Office, the entire contents of which are incorporated herein in their entirety by reference.

BACKGROUND

1. Field

Example embodiments relate to a semiconductor integrated circuit, and for example, to a single ended pseudo differential interconnection circuit and/or a single ended pseudo differential signaling method.

2. Description of Related Art

Impedance matching may be important for reducing reflection and/or ringing on a high-speed signal transmission line. Transmission lines including signals having a limited slew rate, a resistor termination, and/or a diffused resistor termination may be used for impedance matching. Transmission lines having a non-resonant length and/or impedance control drivers may be used for impedance matching.

Many CMOS integrated circuits may be interconnected to transmit voltage signals from one part to another part. A transmitting part may be a CMOS inverter and/or a receiving part may be a simple CMOS amplifier, a differential amplifier, or a comparator. The CMOS receiving part may act as a high impedance termination or a load on a transmission line. A high impedance termination may be problematical because a switching response time or signal delay may be determined by the transmitting part's capability of charging a transmission line capacitor and/or a load capacitor. Capacitive coupling and/or large voltage switching on neighboring signal lines may generate a large noise voltage on signal transmission lines.

Accordingly, two conventional interconnection methods that may not be affected by a voltage signal are used. The first conventional method is single sided/single ended interconnection and the second conventional method is differential interconnection. The conventional differential interconnection may be preferable for reduction of common mode noise. However, the conventional differential interconnection may require two transmission lines and/or need as many as twice as many input/output pads and packaging pins as the number of input/output pads and packaging pins of the conventional single sided/single ended interconnection in I/O application. The necessity for two transmission lines may complicate a chip surface area in a specific CMOS application.

Single sided/single ended pseudo differential interconnection may have several advantages including removal of power supply voltage noise. A pseudo differential amplifier may compare an input voltage transmitted through a single transmission line with a reference voltage.

FIG. 1 is a diagram for explaining a conventional method for generating an on-chip reference voltage Vref. Referring to FIG. 1, a DQ line 130 may be a single ended signal line connected between a transmitter 110 and a receiver 120. The reference voltage Vref may be generated by resistors R1 and R2 connected between a power supply voltage source VDDQ and a ground voltage source VSSQ. The receiver 120 may compare data transmitted through the DQ line 130 to the reference voltage Vref to determine whether the data is at a logic high level or at a logic low level. The reference voltage Vref may be shared by a plurality of DQ lines arranged in parallel.

In this case, noise generated in the power supply voltage source VDDQ of the receiver 120 may be applied to the DQ line 130 and the reference voltage Vref in a common mode, and/or the noise may be removed in the receiver 120. However, noise generated in the power supply voltage source VDDQ and the ground voltage VSSQ of the transmitter 110 may be applied only to the DQ line 130 and/or noise generated in the ground voltage VSSQ of the receiver 120 may be applied only to the reference voltage Vref.

FIG. 2 is a diagram for explaining a conventional method of generating a reference voltage Vref for improving the conventional method illustrated in FIG. 1. Referring to FIG. 2, a transistor 211 may be turned on in response to a reference voltage generating signal H provided by a transmitter 210. First and second resistors R1 and R2 serially connected to a power supply voltage source VDDQ of a receiver 220 may be connected to a ground voltage source VSSQ through the transistor 211 of the transmitter 210. The reference voltage Vref may be generated according to voltage distribution by the first and second resistors R1 and R2. The reference voltage Vref may be shared by a plurality of DQ lines 230 arranged in parallel. Ground voltage common noise of the transmitter 210 may be applied to both the DQ lines 230 and the reference voltage Vref and/or ground voltage common noise of the receiver 220 may not be applied to both the DQ lines 230 and the reference voltage Vref. Accordingly, the method illustrated in FIG. 2 may have higher noise removal capability than the method illustrated in FIG. 1.

However, if the number of the DQ lines 230 arranged in parallel is increased, the reference voltage Vref has to be supplied to more distant DQ lines. The power supply voltage source VDDQ provided to the DQ lines 230 may have different noise values due to voltage drop according to resistances of power supply lines in a chip. Accordingly, there may be generated a difference between common noise generated in the power supply voltage source VDDQ of the DQ lines 230 and common noise applied to the reference voltage Vref.

Input capacitance of a reference voltage line may be larger than input capacitance of the DQ lines 230 because the plurality of DQ lines 230 may be coupled to the reference voltage Vref. Accordingly, RF noise applied to a channel may have different values if applied to the DQ lines 230 and the reference voltage Vref. The phase of noise generated in the transmitter 210 may be varied in the receiver 220 and the noise may act as peaking because there may be a difference between the length of the channel between the reference voltage Vref and a distant DQ line and the length of other channels.

SUMMARY

Example embodiments may provide a single ended pseudo differential interconnection circuit configured to remove power common noise and/or data common noise of a single ended signal line.

Example embodiments may provide a single ended pseudo differential signaling method.

According to an example embodiment, a single ended pseudo differential interconnection circuit may include a transmitter and/or a receiver. The transmitter may be configured to transmit n (n≧2) data signals and a transmit signal. The receiver may be configured to receive the n data signals and the transmit signal. The receiver may include a data judgment unit. The data judgment unit may be configured to sequentially compare neighboring two signals of a first group of the data signals including half (n/2) of the n data signals and the transmit signal, generate first through (n/2)th detection signals, sequentially compare neighboring two signals of a second group of the data signals including the remaining half of the n data signals, and/or generate ((n/2)+1)th through nth detection signals.

According to an example embodiment, the transmit signal may be a compelled signal. The receiver may include a decoder. The decoder may be configured to receive the compelled signal and the first through (n/2)th detection signals to generate first through (n/2)th decoded signals, and/or receive the compelled signal and the ((n/2)+1)th through nth detection signals to generate ((n/2)+1)th through nth decoded signals.

According to an example embodiment, the data judgment unit may include first through (n/2)th level detectors configured to respectively compare neighboring two signals among the n/2 data signals of the first group and the compelled signal, and/or generate the first through (n/2)th detection signals in response to differences between the compared signals of the first group.

According to an example embodiment, the data judgment unit may include (n/2+1)th through nth level detectors configured to respectively compare neighboring two signals among the compelled signal and the n/2 data signals of the second group, and/or generate the (n/2+1) through nth detection signals in response to differences between the compared signals of the second group.

According to an example embodiment, each of the level detectors may include a first comparator, a second comparator, a first flip-flop, a second flip-flop, and/or an output unit. The first comparator may be configured to compare neighboring two signals among the data signals and the compelled signal to a positive or negative reference voltage. The second comparator may be configured to compare neighboring two signals among the data signals and the compelled signal to the negative or positive reference voltage. The first flip-flop may be configured to sample the output of the first comparator. The second flip-flop may be configured to sample the output of the second comparator. The output unit may be configured to receive the outputs of the first and second flip-flops and generate one of the detection signals.

According to an example embodiment, the first and second comparators may each include first and second resistors, a first NMOS transistor, a second NMOS transistor, a third NMOS transistor, a fourth NMOS transistor, a first current sink, and/or a second current sink. The first and second resistors may have first terminals connected to a power supply voltage source. The first NMOS transistor may have a drain connected to a second terminal of the first resistor and a gate receiving one of the neighboring two signals. The second NMOS transistor may have a drain connected to a second terminal of the second resistor and a gate receiving the other one of the neighboring two signal. The third NMOS transistor may have a drain connected to the drain of the first NMOS transistor and a gate receiving the positive reference voltage. The fourth NMOS transistor may have a drain connected to the drain of the second NMOS transistor and a gate receiving the negative reference voltage. The first current sink may be connected between the sources of the first and second NMOS transistors and a ground voltage source. The second current sink may be connected between the sources of the second and fourth NMOS transistors and the ground voltage source.

According to an example embodiment, the output unit may include a NOR gate configured to receive the outputs of the first and second flip-flops and/or output the one detection signal.

According to an example embodiment, the receiver may include a reference voltage generator. The reference voltage generator may be configured to generate the positive and negative reference voltages. The reference voltage generator may include first and second resistors serially connected between a power supply voltage source and a ground voltage source. The power supply voltage may be output as the positive reference voltage, and/or the voltage at a connecting node between the first and second resistors may be output as the negative reference voltage.

According to an example embodiment, the decoder may include first through (n/2) exclusive OR gates. The (n/2)th exclusive OR gate of the plurality of exclusive OR gates may be configured to receive the compelled signal and the (n/2)th detection signal and/or output the (n/2)th decoded signal. If n≧4, the ((n/2)−1)th through first exclusive OR gates may be configured to receive the decoded signal of the immediately next exclusive OR gate and the corresponding detection signal and/or output the corresponding decoded signal.

According to an example embodiment, the decoder may include ((n/2)+1)th through nth exclusive OR gates. The ((n/2)+1)th exclusive OR gate may be configured to receive the compelled signal and the ((n/2)+1)th detection signal and/or output the ((n/2)+1)th decoded signal. If n≧4, the ((n/2)+2)th through nth exclusive OR gates may be configured to receive the decoded signal of the immediately previous exclusive OR gate and the corresponding detection signal and/or output the corresponding decoded signal.

According to an example embodiment, the compelled signal may have one of a logic low level and a logic high level.

According to another example embodiment, the n (n≧2) data signals may be n (n≧4) encoded data signals. The transmitter may be configured to encode n (n≧4) data signals signal as the n (n≧4) encoded data signals. The transmit signal may be an inversion flag signal. The receiver may include a decoder. The decoder may be configured to receive a compelled signal and the first through (n/2)th detection signals to generate first through (n/2)th decoded signals and receive the compelled signal and the ((n/2)+1)th through nth detection signals to generate ((n/2)+1)th through nth decoded signals.

According to another example embodiment, the transmitter may include a data inversion encoder and/or a buffering unit. The data inversion encoder may be configured to invert the n data signals, output the n inverted data signals as the n encoded data signals, and/or output the inversion flag signal as a logic high signal if the number of data signals having a logic low level among the n data signals is greater than n/2. The buffering unit may be configured to transfer the n encoded data signals and the inversion flag signal to the data judgment unit.

According to another example embodiment, the data judgment unit may include first through (n/2)th level detectors configured to respectively compare neighboring two signals among the n/2 encoded data signals of the first group and the inversion flag signal, and/or generate the first through (n/2)th detection signals in response to differences between the compared signals of the first group.

According to another example embodiment, the data judgment unit may include (n/2+1)th through nth level detectors configured to respectively compare neighboring two signals among the inversion flag signal and the n/2 encoded data signals of the second group, and/or generate the (n/2+1)

through nth detection signals in response to differences between the compared signals of the second group.

According to an example embodiment, each of the level detectors may include a first comparator, a second comparator, a first flip-flop, a second flip-flop, and/or an output signal. The first comparator may be configured to compare neighboring two signals among the inversion flag signal and the encoded data signals to a positive or negative reference voltage. The second comparator may be configured to compare neighboring two signals among the inversion flag signal and the encoded data signals to the negative or positive reference voltage. The first flip-flop may be configured to sample the output of the first comparator. The second flip-flop may be configured to sample the output of the second comparator. The output unit may be configured to receive the outputs of the first and second flip-flops and generate one of the detection signals.

According to another example embodiment, the first and second comparators may each include first and second resistors, a first NMOS transistor, a second NMOS transistor, a third NMOS transistor, a fourth NMOS transistor, a first current sink, and/or a second current sink. The first and second resistors may have first terminals connected to a power supply voltage source. The first NMOS transistor may have a drain connected to a second terminal of the first resistor and a gate receiving one of the neighboring two signal. The second NMOS transistor may have a drain connected to a second terminal of the second resistor and a gate receiving the other one of the neighboring two signals. The third NMOS transistor may have a drain connected to the drain of the first NMOS transistor and a gate receiving the positive reference voltage. The fourth NMOS transistor may have a drain connected to the drain of the second NMOS transistor and a gate receiving the negative reference voltage. The first current sink may be connected between the sources of the first and second NMOS transistors and a ground voltage source. The second current sink may be connected between the sources of the second and fourth NMOS transistors and the ground voltage source.

According to another example embodiment, the output unit may include a NOR gate configured to receive the outputs of the first and second flip-flops and/or output the one detection signal.

According to another example embodiment, the receiver may include a reference voltage generator. The reference voltage generator may be configured to generate the positive and negative reference voltages, the reference voltage generator may include first and second resistors serially connected between a power supply voltage source and a ground voltage source. The power supply voltage may be output as the positive reference voltage. The voltage at a connecting node between the first and second resistors may be output as the negative reference voltage.

According to another example embodiment, the decoder may include first through (n/2) exclusive OR gates. The (n/2)th exclusive OR gate of the plurality of exclusive OR gates may be configured to receive the compelled signal and the (n/2)th detection signal, and/or output the (n/2)th decoded signal. The ((n/2)−1)th through first exclusive OR gates may be configured to receive the decoded signal of the immediately next exclusive OR gate and the corresponding detection signal, and/or output the corresponding decoded signal.

According to another example embodiment, the decoder may include ((n/2)+1)th through nth exclusive OR gates. The ((n/2)+1)th exclusive OR gate may be configured to receive the compelled signal and the ((n/2)+1)th detection signal, and/or output the ((n/2)+1)th decoded signal. The ((n/2)+2)th through nth exclusive OR gates may be configured to receive the decoded signal of the immediately previous exclusive OR gate and the corresponding detection signal, and/or output the corresponding decoded signal.

According to another example embodiment, the compelled signal has a logic low level.

According to an example embodiment, a single ended pseudo differential signaling method may include transmitting n (n≧2) data signals and a transmit signal; sequentially comparing neighboring two signals of a first group of the data signals including half of the n data signals and the transmit signal, and generating first through (n/2)th detection signals in response to differences between the compared signals; and/or sequentially comparing neighboring two signals of a second group of the data signals including the remaining half of the n data signals and the transmit signal, and generating (n/2+1)th through nth detection signals in response to differences between the compared signals.

According to an example embodiment, the method may include receiving the transmit signal and the first through (n/2)th detection signals and generating first through (n/2)th decoded signals. The transmit signal may be a compelled signal. An exclusive OR operation may be performed on the compelled signal and the (n/2)th detection signal to output the (n/2)th decoded signal. If n≧4, an exclusive OR operation may be performed on each of the ((n/2)−1)th through first detection signals and the corresponding immediately next decoded signal to output the corresponding decoded signal. The method may include receiving the transmit signal and the (n/2+1)th through nth detection signals and generating (n/2+1)th through nth decoded signals. An exclusive OR operation may be performed on the compelled signal and the ((n/2)+1)th detection signal to output the ((n/2+1)th decoded signal. If n≧4, an exclusive OR operation may be performed on each of the ((n/2)+2)th through nth detection signals and the corresponding immediately previous decoded signal to output the corresponding decoded signal.

According to an example embodiment, the compelled signal may have a logic low level or a logic high level.

According to another example embodiment, the method may include encoding the n data signals prior to transmitting the n data signals and the transmit signal n may be greater than or equal to 4 (n≧4) and the transmit signal may be an inversion flag signal. The method may include receiving the compelled signal and the first through (n/2)th detection signals and generating first through (n/2)th decoded signals. An exclusive OR operation may be performed on the compelled signal and the (n/2)th detection signal to output the (n/2)th decoded signal. An exclusive OR operation may be performed on each of the ((n/2)−1)th through first detection signals and the corresponding immediately next decoded signal to output the corresponding decoded signal. The method may include receiving the compelled signal and the (n/2+1)th through nth detection signals and generating (n/2+1)th through nth decoded signals. An exclusive OR operation may be performed on the compelled signal and the ((n/2)+1)th detection signal to output the ((n/2+1)th decoded signal. An exclusive OR operation may be performed on each of the ((n/2)+2)th through nth detection signals and the corresponding immediately previous decoded signal to output the corresponding decoded signal.

According to another example embodiment, the encoding the n data signals step may include inverting the n data signals to generate n encoded data signals and the inversion flag signal; outputting the inversion flag signal as a logic high signal if the number of data signals having a logic low level among the n data signals is greater than n/2; and/or transmitting the n encoded data signals and the inversion flag signal;

According to another example embodiment, the compelled signal may have a logic low level.

Accordingly, the pseudo differential signaling method according to example embodiments may judge transmitted data without being affected by power common noise and data common noise of a single ended signal line.

BRIEF DESCRIPTION OF THE DRAWINGS

The above and/or other aspects and advantages will become more apparent and more readily appreciated from the following detailed description of example embodiments taken in conjunction with the accompanying drawings of which.

DETAILED DESCRIPTION OF EXAMPLE EMBODIMENTS

Figure 1:
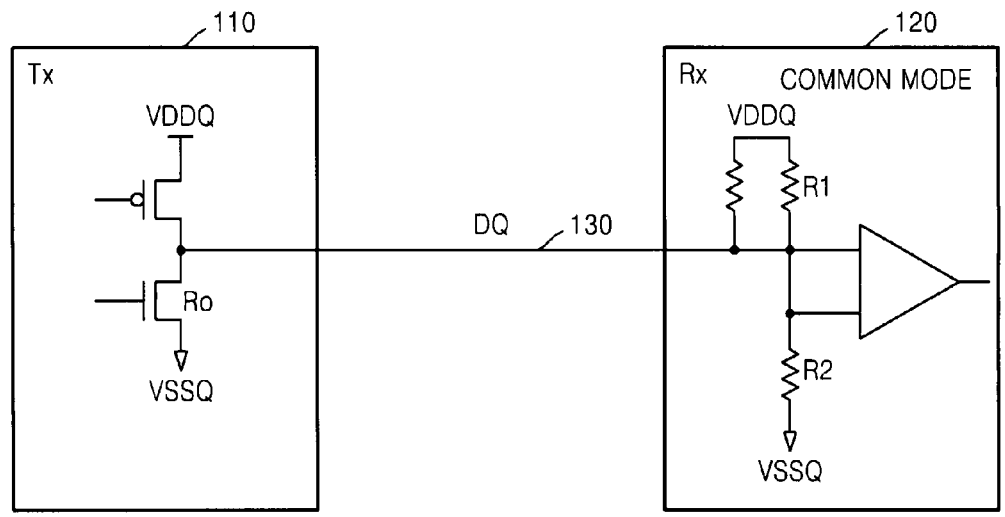
FIG. 1 is a diagram for explaining a conventional method for generating an on-chip reference voltage.
Figure 2:
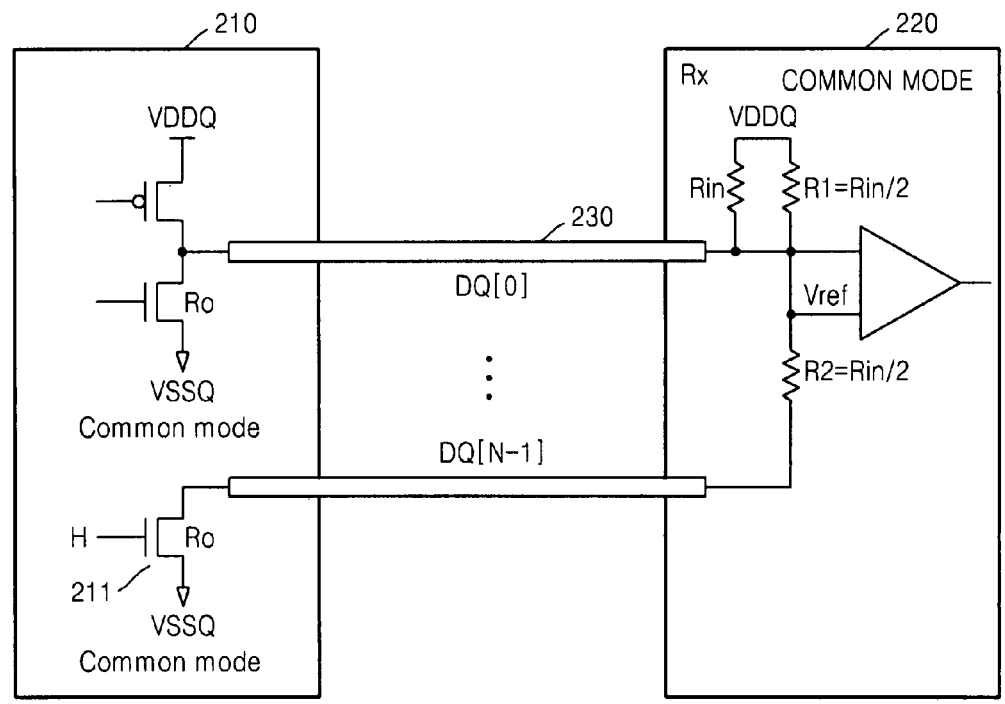
FIG. 2 is a diagram for explaining a conventional method for generating a matched reference voltage.

Example embodiments will now be described more fully hereinafter with reference to the accompanying drawings. Embodiments may, however, be embodied in many different forms and should not be construed as being limited to the example embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when a component is referred to as being "on," "connected to" or "coupled to" another component, it can be directly on, connected to or coupled to the other component or intervening components may-be present. In contrast, when a component is referred to as being "directly on," "directly connected to" or "directly coupled to" another component, there are no intervening components present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one component or feature's relationship to another component(s) or feature(s) as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made to example embodiments, which are illustrated in the accompanying drawings, wherein like reference numerals refer to the like components throughout.

Figure 3:
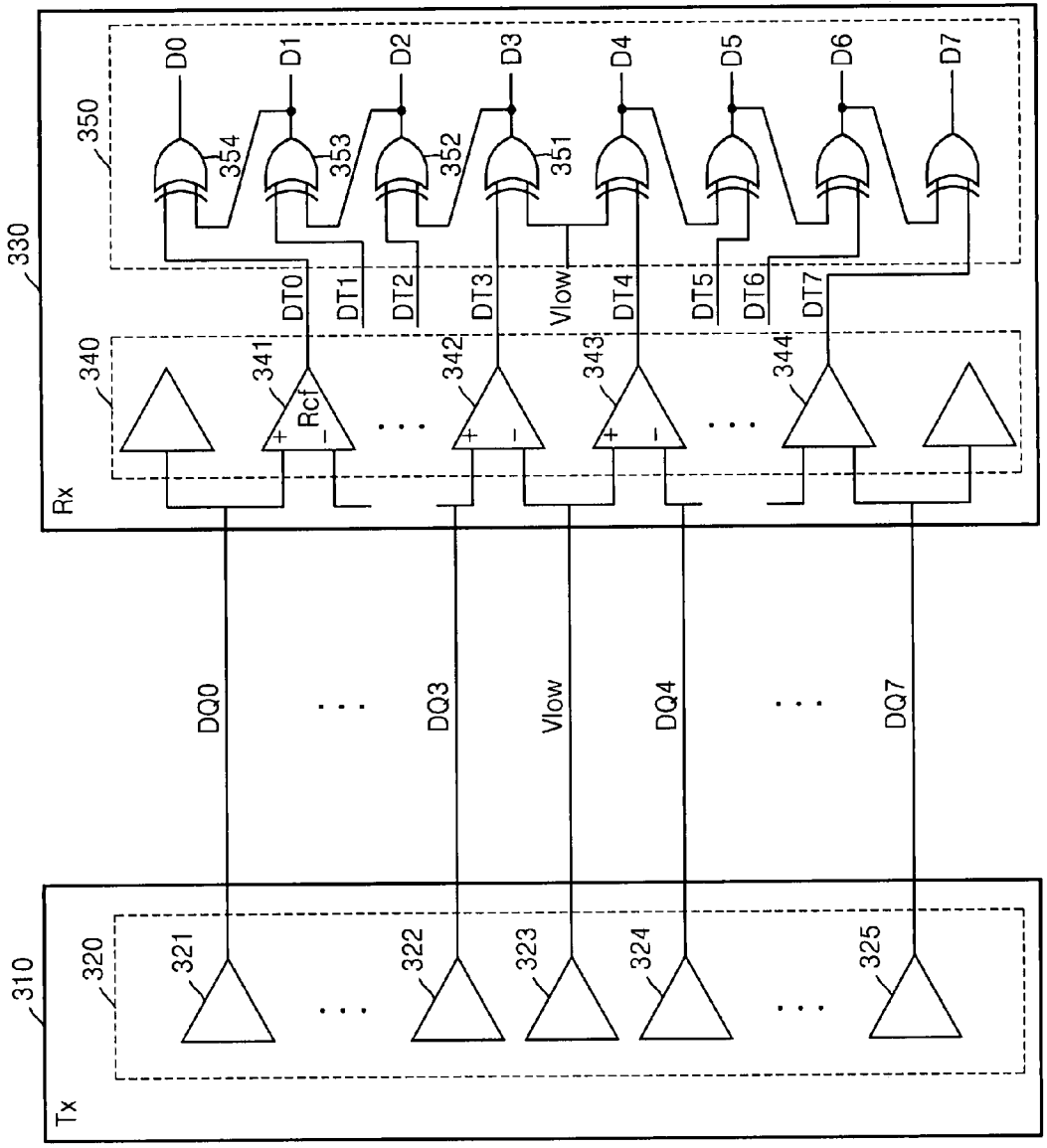
FIG. 3 is a diagram for explaining a pseudo differential signaling method according to an example embodiment.

FIG. 3 is a diagram for explaining a pseudo differential signaling method according to an example embodiment. Referring to FIG. 3, a plurality of data input/output lines respectively transmitting data signals DQ0 through DQ7 may be connected between a transmitter 310 and a receiver 330. The transmitter 310 may include a buffering unit 320 including buffers 321 and 322 driving the data input/output lines transmitting the data signals DQ0, DQ1, DQ2 and DQ3, a buffer 323 driving a line transmitting a compelled signal Vlow, and/or buffers 324 and 325 driving the data input/output lines transmitting the data signals DQ4, DQ5, DQ6 and DQ7. The data input/output lines transmitting the data signals DQ0 through DQ7 and the line transmitting the compelled signal Vlow may be connected to the receiver 330 according to single ended signaling. While the pseudo differential signaling method is explained for eight data input/output lines in example embodiments, it will be understood by those of ordinary skill in the art that the number of data signal lines is not limited thereto, and the pseudo differential signaling method of example embodiments may be for more or less than eight data input/output lines.

The receiver 330 may include a data judgment unit 340 judging the data signals DQ0 through DQ7 transmitted through the data input/output lines and a decoder 350 decoding the outputs of the data judgment unit 340. The data judgment unit 340 may include a plurality of level detectors 341, 342, 343 and 344 each comparing data signals of neighboring data input/output lines to each other. A first level detector 341 may compare the data DQ0 with the data DQ1 and/or output a first detection signal DT0. A second level detector (not shown) may compare the data DQ1 with the data DQ2 and/or output a second detection signal DT1. A third level detector (not shown) may compare the data DQ2 with the data DQ3 and/or output a third detection signal DT2. A fourth level detector 342 may compare the data DQ3 with the compelled signal Vlow and/or output a fourth detection signal DT3.

Figure 4:
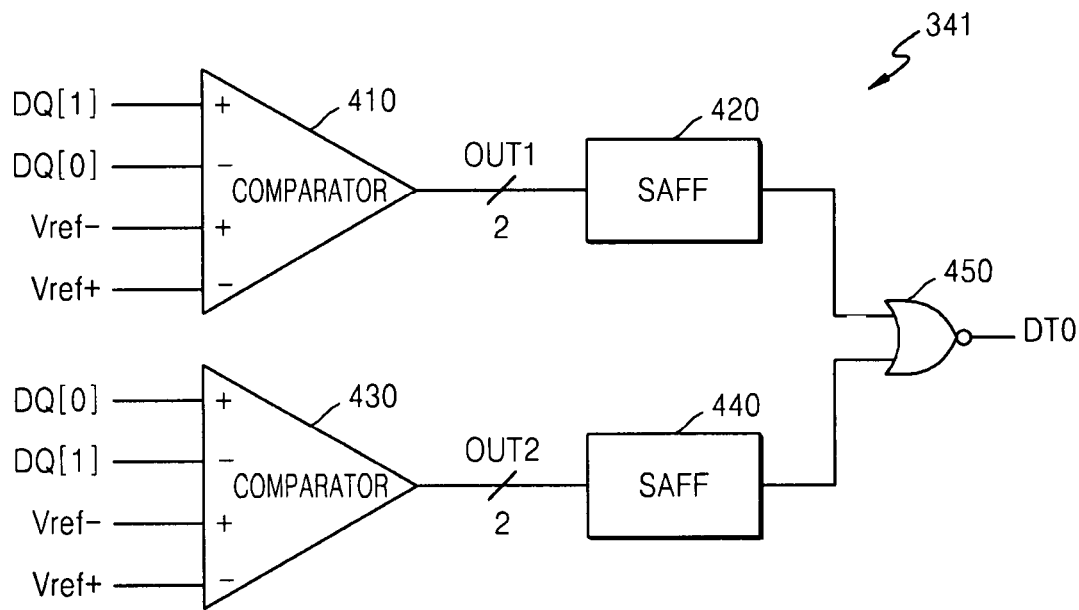
FIG. 4 illustrates a configuration of a first level detector illustrated in FIG. 3.

Representatively, the first level detector 341 is explained in more detail with reference to FIG. 4. Referring to FIG. 4, the first level detector 341 may include first and second comparators 410 and 430 receiving the data DQ0, the data DQ1, a positive reference voltage Vref+ and a negative reference voltage Vref−, first and second flip-flops 420 and 440 respectively sampling the output signals of the first and second comparators 410 and 430, and/or an output unit 450 receiving the output signals of the first and second flip-flops 420 and 440 and generating the first detection signal DT0.

Figure 5:
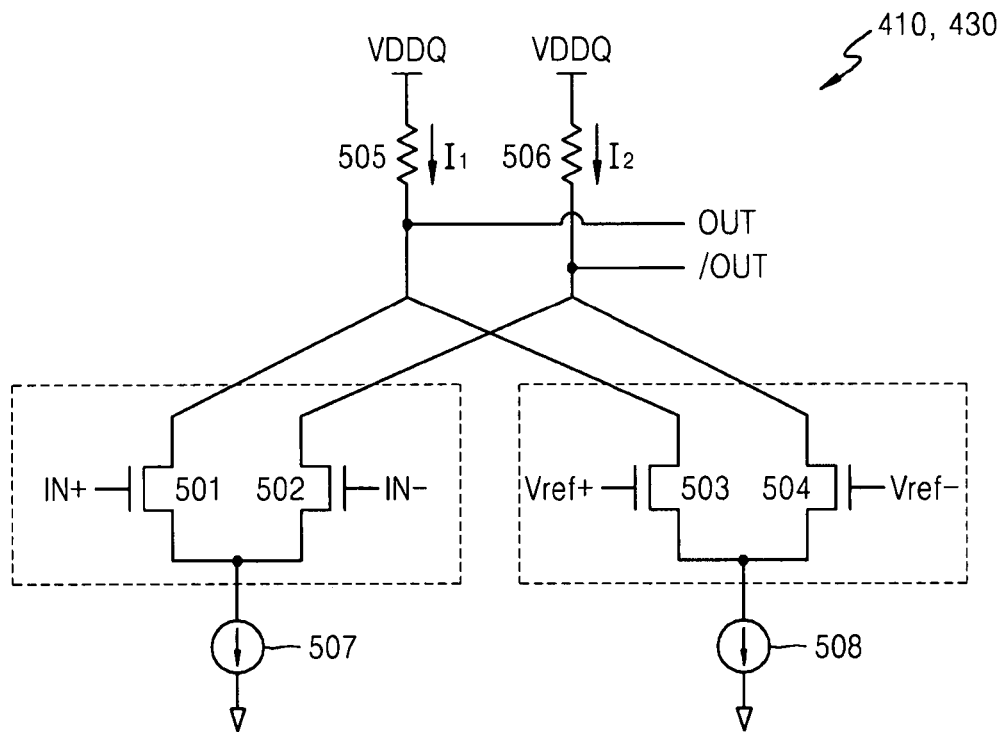
FIG. 5 is a circuit diagram of a comparator illustrated in FIG. 4.

FIG. 5 is a circuit diagram of the first and second comparators 410 and 430. Referring to FIG. 5, the first and second comparators 410 and 430 may include a first NMOS transistor 501 connected to a positive input terminal IN+, a second NMOS transistor 502 connected to a negative input terminal IN−, a third NMOS transistor 503 connected to a positive reference voltage terminal Vref+, and a fourth NMOS transistor 504 connected to a negative reference voltage terminal Vref−. The drains of the first and third NMOS transistors 501 and 503 may be connected to a first terminal of a first resistor 505 and/or the drains of the second and fourth NMOS transistors 502 and 504 may be connected to a first terminal of a second resistor 506. Second terminals of the first and second resistors 505 and 506 may be connected to the source of a power supply voltage VDDQ. The first and second resistors 505 and 506 may have the same resistance. The sources of the first and second NMOS transistors 501 and 502 may be connected to the source of a ground voltage through a first current sink 507. The sources of the third and fourth NMOS transistors 503 and 504 may be connected to the source of the ground voltage through a second current sink 508.

In the first and second comparators 410 and 430, a current difference ΔI may be generated between current I1 flowing through the first resistor 505 and current I2 flowing through the second resistor 506 in response to signals input to the positive input terminal IN+, the negative input terminal IN−, the positive reference voltage terminal Vref+ and the negative reference voltage terminal Vref−. The current difference ΔI is represented by Equation (1) as follows:

$$\Delta I = gm(V(IN+) - V(IN-) - V(Vref+) + V(Vref-)) \quad (1)$$

In Equation (1), gm denotes the current gain of the first and second comparators 410 and 430.

The outputs OUT and /OUT of the first and second comparators 410 and 430 may have a voltage difference between them because the resistances of the first and second resistors 505 and 506 may be multiplied by the current difference ΔI.

The first comparator 410 may receive the data DQ1 through the positive input terminal IN+ and receive the data DQ0 through the negative input terminal IN−. The second comparator 430 may receive the data DQ0 through the positive input terminal IN+ and receive the data DQ1 through the negative input terminal IN−. Accordingly, the first and second NMOS transistors 501 and 502 may remove a common noise component of the data input/output lines transmitting the data signals DQ0 and DQ1.

The first comparator 410 and the second comparator 430 may receive the positive reference voltage Vref+ through the positive reference voltage terminal Vref+ and receive the negative reference voltage Vref− through the negative reference voltage terminal Vref−. Accordingly, the third and fourth NMOS transistors 503 and 504 may remove a common noise component of lines transmitting the positive and negative reference voltages Vref+ and Vref−.

Figure 6:
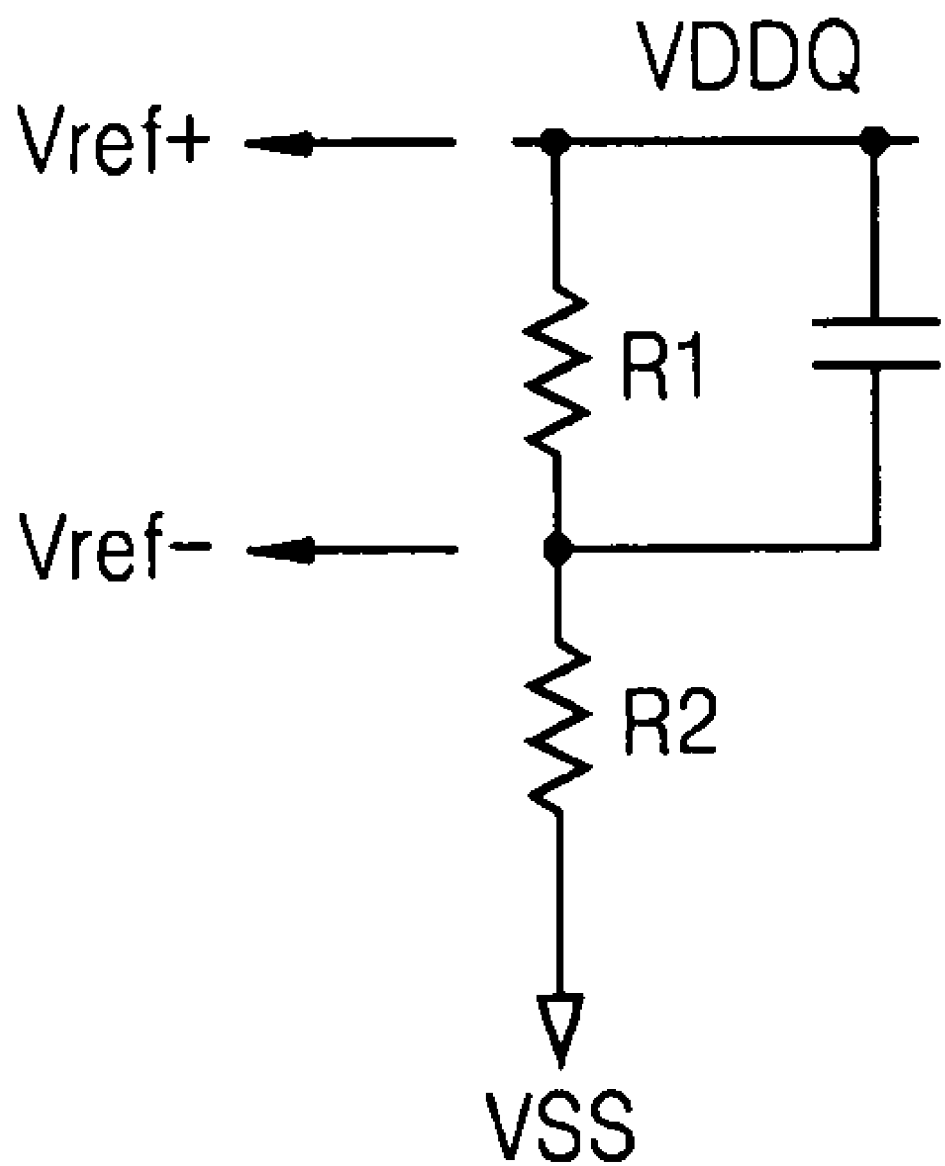
FIG. 6 is a circuit diagram of a circuit of generating positive and negative reference voltages illustrated in FIG. 4.

Referring to FIG. 6, the positive and negative reference voltages Vref+ and Vref− may be determined according to a voltage distribution by resistors R1 and R2 connected between the source of the power supply voltage VDDQ and the source of a ground voltage VSS. A capacitor may be connected in parallel with resistor R1.

Referring back to FIG. 4, the data signals DQ0 and DQ1 input to the first level detector 341 may be as follows.

| DQ1 (DQ[N]) | DQ0(DQ[N − 1]) | \|Δ\| |
|---|---|---|
| H | H | 0 |
| H | L | Vswing |
| L | H | −Vswing |
| L | L | 0 |

For example, Vswing may denote an input swing width of the data signals DQ0 and DQ1.

The first and second comparators 410 and 430 may output first and second output signals OUT1 and OUT2 having a logic high level H if the data signals DQ0 and DQ1 have a same logic level, for example, if DQ0=H and DQ1=H or DQ0=L and DQ1=L. The first and second comparators 410 and 430 may output the first and second output signals OUT1 and OUT2 having a logic low level L if the data signals DQ0 and DQ1 have different logic levels, for example, if DQ0=H and DQ1=L or DQ0=L and DQ1=H. The first and second flip-flops 420 and 440 may respectively sample the first and second output signals OUT1 and OUT2 of the first and second comparators 410 and 430 and/or transmit the sampled signals to the output unit 450. The output unit 450 may include a NOR gate, and/or the output unit 450 may receive the output signals of the first and second flip-flops 420 and 440 and output the first detection signal DT0.

Accordingly, the first level detector 341 may output the first detection signal DT0 having a logic low level L if the data signals DQ0 and DQ1 have the same logic level and/or output the first detection signal DT0 having a logic high level H if the data signals DQ0 and DQ1 have different logic levels.

The operation of the data judgment unit 340 based on the operation of the first level detector 341 will be explained.

It may be assumed that the compelled signal Vlow having a logic low level is supplied from the transmitter 310. The first, second, third and fourth detection signals DT0, DT1, DT2 and DT3 may respectively have logic levels L, H, L and H if the data signals DQ0, DQ1, DQ2 and DQ3 transmitted from the transmitter 310 respectively have logic levels L, H, H and L.

The decoder 350 may receive the compelled signal Vlow and the first, second, third and fourth detection signals DT0, DT1, DT2 and DT3 and/or output first, second, third and fourth decoded signals D0, D1, D2 and D3. The decoder 350 may include a first exclusive OR gate 351 receiving the compelled signal Vlow and the fourth detection signal DT3 and outputting the fourth decoded signal D3, a second exclusive OR gate 352 receiving the fourth decoded signal D3 and the third detection signal DT2 and outputting the third decoded signal D2, a third exclusive OR gate 353 receiving the third decoded signal D2 and the second detection signal DT1 and outputting the second decoded signal D1, and/or a fourth exclusive OR gate 354 receiving the second decoded signal D1 and the first detection signal DT0 and outputting the first decoded signal D0.

If the first, second, third and fourth detection signals DT0, DT1, DT2 and DT2 respectively have logic levels L, H, L and H, the first, second, third and fourth decoded signals D0, D1, D2 and D3 may respectively have logic levels L, H, H and L. Accordingly, the data signals DQ0, DQ1, DQ2 and DQ3 respectively having logic levels L, H, H and L may be reproduced as the first, second, third and fourth decoded signals D0, D1, D2 and D3 in the receiver 330.

Although the compelled signal Vlow has a logic low level in example embodiments described above, example embodiments are not limited thereto, and a compelled signal having a logic high level may be applied in example embodiments. If the compelled signal has a logic high level high H, the data signals DQ0, DQ1, DQ2 and DQ3 respectively having logic levels L, H, H and L may generate the first, second, third and fourth detection signals DT0, DT1, DT2 and DT3 respectively having logic levels H, L, H and H and/or may be reproduced as the first, second, third and fourth decoded signals D0, D1, D2 and D3.

Although only the data signals DQ0, DQ1, DQ2 and DQ3 transmitted from the transmitter 310 are explained in the example embodiments described above, the data signals DQ4, DQ5, DQ6 and DQ7 may be processed in the same manner. For example, the compelled signal Vlow applied to the receiver 320 between the data signals DQ0, DQ1, DQ2 and DQ3 and the data signals DQ4, DQ5, DQ6 and DQ7 may divide the operation of decoding the data signals DQ0 through DQ7 into two. Dividing the operation of decoding the data signals DQ0 through Dq7 may reduce a delay due to the operation of decoding the data signals DQ0 through DQ7.

Figure 7:
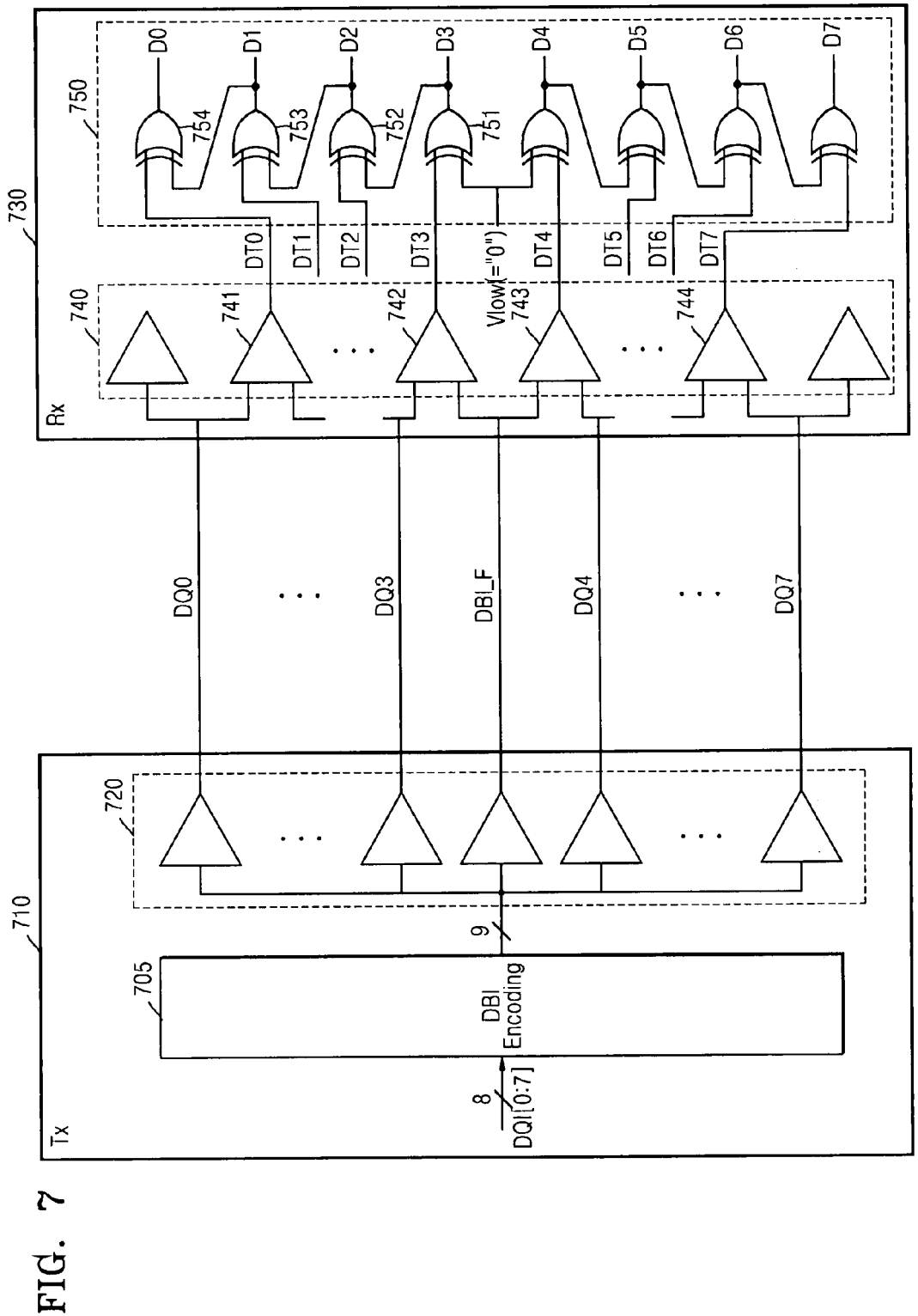
FIG. 7 is a diagram for explaining a pseudo differential signaling method according to another example embodiment.

FIG. 7 is a diagram for explaining a pseudo differential signaling method according to another example embodiment. Referring to FIG. 7, a transmitter 710 may include a data inversion encoder 705 and/or a buffering unit 720. The data inversion encoder 705 may encode 8-bit data DQI[0:7] and/or output 9-bit data including an inversion flag signal DBI_F and/or encoded data DQ0 through DQ7. The data inversion encoder 705 may output the inversion flag signal DBI_F having a value "0" if the number of data bits at a logic low level L(=0) among the data bits of the 8-bit data DQI[0:7] is less than or equal to 4 and/or output the inversion flag signal DBI_F having a value "1" if the number of data bits at a logic low level L(=0) among the data bits of the 8-bit data DQI[0:7] is greater than 4. The 8-bit data DQI[0:7] may be output as encoded data DQ0 through DQ7.

A receiver 730 may include a data judgment unit 740 judging the encoded data DQ0 through DQ7 and/or a decoder 750 decoding the output signals of the data judgment unit 740. The data judgment unit 740 may include level detectors 741, 742, 743 and 744 each comparing neighboring encoded data. The level detectors 741, 742, 743 and 744 may be identical to the level detectors 341, 342, 343 and 344 illustrated in FIG. 3 except that the fourth level detector 742 may compare the encoded data DQ3 with the inversion flag signal DBI_F and/or output the fourth detection signal DT3, and/or the fifth level detector 743 may compare the inversion flag signal DBI_F with the encoded data DQ4 and/or output the fifth detection signal DT4.

The decoder 750 may receive a compelled signal Vlow and the first, second, third and fourth detection signals DT0, DT1, DT2 and DT3 and/or output the first, second, third and fourth decoded signals D0, D1, D2 and D3. The decoder 750 may include a first exclusive OR gate 751 receiving the compelled signal Vlow and the fourth detection signal DT3 and outputting the fourth decoded signal D3, a second exclusive OR gate 752 receiving the fourth decoded signal D3 and the third detection signal DT2 and outputting the third decoded signal D2, a third exclusive OR gate 753 receiving the third decoded signal D2 and the second detection signal DT1 and outputting the second decoded signal D1, and/or a fourth exclusive OR gate 754 receiving the second decoding signal D1 and the first detection signal DT0 and outputting the first decoded signal D0.

The operation of the receiver 730 will be explained.

If the 8-bit data DQI[0:7] of the transmitter 710 is 01110000, the inversion flag signal DBI_F may be output as "1" and the encoded data DQ0 through DQ7 is output as 10001111. The data judgment unit 740 of the receiver 730 may generate first through eighth detection signals DT0 through DT7 respectively having values 1, 0, 0, 1, 0, 0, 0 and 0. The decoder 750 may generate first through eighth decoded signals D0 through D7 respectively having values 0, 1, 1, 1, 0, 0, 0 and 0. Because the number of data having value "0" among the first through eighth decoded signals D0 through D7 is greater than 4, the compelled signal Vlow is wrongly set to "0" on the assumption that the inversion flag signal DBI_F has a value "0". Accordingly, the first through eighth decoded signals D0 through D7, 01110000 may be inverted and generated as 10001111. The encoded data DQ0 through DQ7 having a value 10001111, which is the output of the transmitter 710, may be reproduced as the first through eighth decoded signals D0 through D7.

If the 8-bit data DQI[0:7] of the transmitter 710 is 10011101, the inversion flag signal DBI_F may be output as "0" and the encoded data DQ0 through DQ7 is output as 10011101. The data judgment unit 740 of the receiver 730 may generate the first through eighth detection signals DT0 through DT7 respectively having values 1, 0, 1, 1, 1, 0, 1 and 1. The decoder 750 may generate the first through eighth decoded signals D0 through D7 respectively having values 1, 0, 0, 1, 1, 1, 0 and 1. Because the number of data having a value "0" among the first through eighth decoded signals D0 through D7 is less than 4, the compelled signal Vlow is correctly set to "0" on the assumption that the inversion flag signal DBI_F has a value "0". Accordingly, the 8-bit data DQI[0:7] of the transmitter 710, which have a value 10011101, may be reproduced as the first through eighth decoded signals D0 through D7.

Although example embodiments have been shown and described in this specification and figures, it would be appreciated by those skilled in the art that changes may be made to the illustrated and/or described example embodiments without departing from their principles and spirit.

What is claimed is:

1. A single ended pseudo differential interconnection circuit comprising:
a transmitter configured to transmit n (n≧2) data signals and a compelled signal; and
a receiver configured to receive the n data signals and the compelled signal, wherein the receiver includes:
a data judgment unit configured to sequentially compare neighboring two signals of a first group of the data signals including half (n/2) of the n data signals and the compelled signal, generate first through (n/2)th detection signals, sequentially compare neighboring two signals of a second group of the data signals including the remaining half of the n data signals, and generate ((n/2)+1)th through nth detection signals, and
a decoder configured to receive the compelled signal and the first through (n/2)th detection signals to generate first through (n/2)th decoded signals and receive the compelled signal and the ((n/2)+1)th through nth detection signals to generate ((n/2)+1)th through nth decoded signals.

2. The circuit of claim 1, wherein the data judgment unit includes first through (n/2)th level detectors configured to respectively compare neighboring two signals among the n/2 data signals of the first group and the compelled signal, and generate the first through (n/2)th detection signals in response to differences between the compared signals of the first group.

3. The circuit of claim 2, wherein the data judgment unit includes (n/2+1)th through nth level detectors configured to respectively compare neighboring two signals among the compelled signal and the n/2 data signals of the second group, and generate the (n/2+1) through nth detection signals in response to differences between the compared signals of the second group.

4. The circuit of claim 3, wherein each of the level detectors includes,
a first comparator configured to compare neighboring two signals among the data signals and the compelled signal to a positive or negative reference voltage;
a second comparator configured to compare neighboring two signals among the data signals and the compelled signal to the negative or positive reference voltage;
a first flip-flop configured to sample the output of the first comparator;
a second flip-flop configured to sample the output of the second comparator; and
an output unit configured to receive the outputs of the first and second flip-flops and generate one of the detection signals.

5. The circuit of claim 4, wherein the first and second comparators each include,
first and second resistors having first terminals connected to a power supply voltage source;
a first NMOS transistor having a drain connected to a second terminal of the first resistor and a gate receiving one of the neighboring two signals;
a second NMOS transistor having a drain connected to a second terminal of the second resistor and a gate receiving the other one of the neighboring two signals;
a third NMOS transistor having a drain connected to the drain of the first NMOS transistor and a gate receiving the positive reference voltage;
a fourth NMOS transistor having a drain connected to the drain of the second NMOS transistor and a gate receiving the negative reference voltage;
a first current sink connected between the sources of the first and second NMOS transistors and a ground voltage source; and
a second current sink connected between the sources of the second and fourth NMOS transistors and the ground voltage source.

6. The circuit of claim 4, wherein the output unit includes a NOR gate configured to receive the outputs of the first and second flip-flops and output the one detection signal.

7. The circuit of claim 4, wherein the receiver further includes,
a reference voltage generator configured to generate the positive and negative reference voltages, the reference voltage generator including first and second resistors serially connected between a power supply voltage source and a ground voltage source, and wherein
the power supply voltage is output as the positive reference voltage, and
the voltage at a connecting node between the first and second resistors is output as the negative reference voltage.

8. The circuit of claim 1, wherein the decoder includes,
first through (n/2) exclusive OR gates,
the (n/2)th exclusive OR gate of the plurality of exclusive OR gates configured to receive the compelled signal and the (n/2)th detection signal and output the (n/2)th decoded signal; and
if n≧4, the ((n/2)−1)th through first exclusive OR gates are configured to receive the decoded signal of the immediately next exclusive OR gate and the corresponding detection signal and output the corresponding decoded signal.

9. The circuit of claim 8, wherein the decoder includes,
((n/2)+1)th through nth exclusive OR gates,
the ((n/2)+1)th exclusive QR gate configured to receive the compelled signal and the ((n/2)+1)th detection signal and output the ((n/2)+1)th decoded signal; and
if n≧4, the ((n/2)+2)th through nth exclusive OR gates are configured to receive the decoded signal of the immediately previous exclusive OR gate and the corresponding detection signal and output the corresponding decoded signal.

10. The circuit of claim 1, wherein the compelled signal has one of a logic low level and a logic high level.

11. A single ended pseudo differential interconnection circuit comprising:
a transmitter configured to encode n (n≧4) data signals and an inversion flag signal; and
a receiver configured to receive the n encoded data signals and the inversion flag signal.
wherein the receiver includes:
a data judgment unit configured to sequentially compare neighboring two signals among n/2 encoded data signals of a first group corresponding to half of the n encoded data signals and the inversion flag signal. generate first through (n/2)th detection signals, sequentially compare neighboring two signals among the inversion flag signal and n/2 encoded data signals of a second group corresponding to the other half of the n encoded data signals and generate ((n/2)+1)th through nth detection signals; and
a decoder configured to receive the inversion flag signal and the first through (n/2)th detection signals to generate first through (n/2)th decoded signals and receive the inversion flag signal and the ((n/2)+1)th through nth detection signals to generate ((n/2)+1)th through nth decoded signals.

12. The circuit of claim 11, wherein the transmitter includes,
a data inversion encoder configured to invert the n data signals, output the n inverted data signals as the n encoded data signals, and output the inversion flag signal as a logic high signal if the number of data signals having a logic low level among the n data signals is greater than n/2; and
a buffering unit configured to transfer the n encoded data signals and the inversion flag signal to the data judgment unit.

13. The circuit of claim 11, wherein the data judgment unit includes first through (n/2)th level detectors configured to respectively compare neighboring two signals among the n/2 encoded data signals of the first group and the inversion flag signal, and generate the first through (n/2)th detection signals in response to differences between the compared signals of the first group.

14. The circuit of claim 13, wherein the data judgment unit includes (n/2+1)th through nth level detectors configured to respectively compare neighboring two signals among the inversion flag signal and the n/2 encoded data signals of the second group, and generate the (n/2+1) through nth detection signals in response to differences between the compared signals of the second group.

15. The circuit of claim 14, wherein each of the level detectors includes,
- a first comparator configured to compare neighboring two signals among the inversion flag signal and the encoded data signals to a positive or negative reference voltage;
- a second comparator configured to compare neighboring two signals among the inversion flag signal and the encoded data signals to the negative or positive reference voltage;
- a first flip-flop configured to sample the output of the first comparator;
- a second flip-flop configured to sample the output of the second comparator; and
- an output unit configured to receive the outputs of the first and second flip-flops and generate one of the detection signals.

16. The circuit of claim 15, wherein the first and second comparators each include,
- first and second resistors having first terminals connected to a power supply voltage source;
- a first NMOS transistor having a drain connected to a second terminal of the first resistor and a gate receiving one of the neighboring two signals;
- a second NMOS transistor having a drain connected to a second terminal of the second resistor and a gate receiving the other one of the neighboring two signals;
- a third NMOS transistor having a drain connected to the drain of the first NMOS transistor and a gate receiving the positive reference voltage;
- a fourth NMOS transistor having a drain connected to the drain of the second NMOS transistor and a gate receiving the negative reference voltage;
- a first current sink connected between the sources of the first and second NMOS transistors and a ground voltage source; and
- a second current sink connected between the sources of the second and fourth NMOS transistors and the ground voltage source.

17. The circuit of claim 15, wherein the output unit includes a NOR gate configured to receive the outputs of the first and second flip-flops and output the one detection signal.

18. The circuit of claim 15, wherein the receiver further includes,
- a reference voltage generator configured to generate the positive and negative reference voltages, the reference voltage generator including first and second resistors serially connected between a power supply voltage source and a ground voltage source, and wherein
  - the power supply voltage is output as the positive reference voltage, and
  - the voltage at a connecting node between the first and second resistors is output as the negative reference voltage.

19. The circuit of claim 11, wherein the decoder includes, first through (n/2) exclusive OR gates,
- the (n/2)th exclusive OR gate of the plurality of exclusive OR gates configured to receive the compelled signal and the (n/2)th detection signal, and output the (n/2)th decoded signal; and
- the ((n/2)−1)th through first exclusive OR gates configured to receive the decoded signal of the immediately next exclusive OR gate and the corresponding detection signal, and output the corresponding decoded signal.

20. The circuit of claim 19, wherein the decoder includes, ((n/2)+1)th through nth exclusive OR gates,
- the ((n/2)+1)th exclusive OR gate configured to receive the compelled signal and the ((n/2)+1)th detection signal and output the ((n/2)+1)th decoded signal; and
- the ((n/2)+2)th through nth exclusive OR gates configured to receive the decoded signal of the immediately previous exclusive OR gate, and/or the corresponding detection signal, and output the corresponding decoded signal.

21. The circuit of claim 11, wherein the compelled signal has a logic low level.

22. A single ended pseudo differential signaling method comprising:
- transmitting n ($n \geq 2$) data signals and a compelled signal;
- sequentially comparing neighboring two signals among n/2 data signals of a first group corresponding to half of the n data signals and the compelled signal, and generating first through (n/2)th detection signals in response to differences between the compared signals; and
- sequentially comparing neighboring two signals among the compelled signal and n/2 data signals of a second group corresponding to the other half of the n data signals and generating (n/2+1)th through nth detection signals in response to differences between the compared signals;
- receiving the compelled signal and the first through (n/2)th detection signals and generating first through (n/2)th decoded signals, wherein
  - an exclusive OR operation is performed on the compelled signal and the (n/2)th detection signal to output the (n/2)th decoded signal, and
  - if $n \geq 4$, an exclusive OR operation is performed on each of the ((n/2)−1)th through first detection signals and the corresponding immediately next decoded signal to output the corresponding decoded signal; and
- receiving the compelled signal and the (n/2+1)th through nth detection signals and generating (n/2+1)th through nth decoded signals, wherein
  - an exclusive OR operation is performed on the compelled signal and the ((n/2)+1)th detection signal to output the ((n/2+1)th decoded signal, and if $n \geq 4$, an exclusive OR operation is performed on each of the ((n/2)+2)th through nth detection signals and the corresponding immediately previous decoded signal to output the corresponding decoded signal.

23. The method of claim 22, wherein the compelled signal has a logic low level or a logic high level.

24. A single ended pseudo differential signaling method comprising:
- encoding the n($n \geq 4$) data signals, inverting the n data signals to generate n encoded data signals and an inversion flag signal when the number of data signals having a logic high level among n data signals is greater than n/2, and transmitting the n encoded data signals and the inversion signal;
- sequentially comparing neighboring two signals among n/2 data signals of a first group corresponding to half of the n data signals and the inversion flag signal, and generating first through (n/2)th detection signals in response to differences between the compared signals; and
- sequentially comparing neighboring two signals among the inversion flag signal and n/2 data signals of a second group corresponding to the other half of the n data signals and generating (n/2+1)th through nth detection signals in response to differences between the compared signals; and receiving the inversion flag signal and the first through (n/2)th detection signals and generating first through (n/2)th decoded signals, and wherein an exclusive OR operation is performed on the inversion flag signal and the (n/2)th detection signal to output the (n/2)th decoded signal, and an exclusive OR operation is performed on each of the ((n/2)−1)th through first detection signals and the corresponding immediately next decoded signal to output the corresponding decoded signal; and receiving the inversion flag signal and the (n/2+1)th through nth detection signals and generating (n/2+1)th through nth decoded signals, and wherein an exclusive OR operation is performed on the inversion flag signal and the ((n/2)+1)th detection signal to output the ((n/2+1)th decoded signal, and an exclusive OR operation is performed on each of the ((n/2)+2)th through nth detection signals and the corresponding immediately previous decoded signal to output the corresponding decoded signal.

25. The method of claim 24, wherein the encoding the n data signals step includes, inverting the n data signals to generate n encoded data signals and the inversion flag signal;

outputting the inversion flag signal as a logic high signal if the number of data signals having a logic low level among the n data signals is greater than n/2; and transmitting the n encoded data signals and the inversion flag signal.

26. The method of claim 24, wherein the inversion flag signal has a logic low level.

* * * * *